United States Patent
Eleftheriou et al.

(10) Patent No.: US 7,885,030 B2
(45) Date of Patent: Feb. 8, 2011

(54) METHODS AND SYSTEMS FOR DELAY COMPENSATION IN GLOBAL PLL-BASED TIMING RECOVERY LOOPS

(75) Inventors: Evangelos S. Eleftheriou, Rueschlikon (CH); Robert Allen Hutchins, Tucson, AZ (US); Sedat Oelcer, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 241 days.

(21) Appl. No.: 12/168,723

(22) Filed: Jul. 7, 2008

(65) Prior Publication Data

US 2010/0001772 A1 Jan. 7, 2010

(51) Int. Cl.
*G11B 5/035* (2006.01)

(52) U.S. Cl. .......................... 360/65; 360/51; 327/158; 375/376

(58) Field of Classification Search ........................ None
See application file for complete search history.

(56) References Cited

U.S. PATENT DOCUMENTS

| | | | | |
|---|---|---|---|---|
| 5,488,516 A | * | 1/1996 | Kalfs et al. | 360/51 |
| 5,568,078 A | | 10/1996 | Lee | 327/262 |
| 5,570,053 A | * | 10/1996 | Takla | 327/292 |
| 5,786,953 A | * | 7/1998 | Kalfs | 360/51 |
| 5,986,834 A | * | 11/1999 | Colineau et al. | 360/51 |
| 6,236,343 B1 | | 5/2001 | Patapoutian | 341/111 |
| 6,366,146 B2 | | 4/2002 | Fredriksson | 327/156 |
| 6,560,299 B1 | * | 5/2003 | Strolle et al. | 375/347 |
| 6,819,514 B1 | | 11/2004 | Behrens et al. | 360/65 |
| 2007/0164798 A1 | | 7/2007 | Nikolov et al. | 327/156 |

OTHER PUBLICATIONS

Patapoutian, Ara, "Application of Kalman Filters With a Loop Delay in Synchronization" IEEE Transactions on Communications, vol. 50, No. 5, May 2002.
Timing Control Using State Estimation IBM Confidential; Jul. 2, 1998.

* cited by examiner

*Primary Examiner*—Jason C Olson
(74) *Attorney, Agent, or Firm*—Zilka-Kotab, PC

(57) ABSTRACT

A system in one embodiment includes a global PLL circuit comprising multiple inputs, each input being for receiving an error signal associated with an individual channel; and a delay compensation circuit coupled to the global PLL circuit. A method in one embodiment includes receiving multiple error signals, each error signal being associated with an individual channel; applying one or more delay compensation signals to the error signals; and outputting phase error output signals for each of the channels.

25 Claims, 10 Drawing Sheets

METHODS AND SYSTEMS FOR DELAY COMPENSATION IN GLOBAL PLL-BASED TIMING RECOVERY LOOPS

BACKGROUND

The present invention relates to delay compensation, and more particularly, this invention relates to delay compensation in global phase-locked loop- or phase lock loop-(PLL)-based timing recovery loops.

A PLL is a control system that generates a signal that has a fixed relation to the phase of a "reference" signal. A PLL circuit responds to both the frequency and the phase of the input signals, automatically raising or lowering the frequency of a controlled oscillator until it is matched to the reference in both frequency and phase.

Analog PLLs generally include a phase detector, low pass filter and voltage-controlled oscillator (VCO) placed in a negative feedback closed-loop configuration. There may be a frequency divider in the feedback path or in the reference path, or both, in order to make the PLL's output signal frequency an integer multiple of the reference. A non integer multiple of the reference frequency can be created by replacing the simple divide-by-N counter in the feedback path with a programmable pulse swallowing counter. This technique is usually referred to as a fractional-N synthesizer or fractional-N PLL.

The oscillator generates a periodic output signal. Assume that initially the oscillator is at nearly the same frequency as the reference signal. Then, if the phase from the oscillator falls behind that of the reference, the phase detector changes the control voltage of the oscillator, so that it speeds up. Likewise, if the phase creeps ahead of the reference, the phase detector changes the control voltage to slow down the oscillator. A low-pass filter smooths out abrupt changes in the control voltage; it can be demonstrated that some filtering is required for a stable system. Since initially the oscillator may be far from the reference frequency, practical phase detectors may also respond to frequency differences, so as to increase the lock-in range of allowable inputs.

Depending on the application, either the output of the controlled oscillator, or the control signal to the oscillator, provides the useful output of the PLL system.

A Digital Phase-Locked Loop (DPLL) operates similarly to an analog phase-locked loop, but is implemented entirely using digital circuits. In place of a voltage-controlled oscillator (VCO), a DPLL uses a counter with a variable divisor. DPLLs are sometimes used for data recovery.

Loop delay in timing control loops is known to degrade system performance. In any PLL implementation, therefore, the designer aims at minimizing loop delay, so that the PLL phase margin is maximized and a stiff and robust behavior of the timing control loop is achieved. Unfortunately, implementation and architectural constraints often introduce some substantial delay in the timing loop circuit. Such unavoidable loop delays then force the designer to re-adjust the PLL phase margin and bandwidth, and thereby suffer a loss in PLL performance. In data storage applications, the reduced PLL performance translates into a performance loss of the overall read channel. Consequently, the raw bit-error rate of the read channel is degraded.

As another example, a well-known trade-off situation arises when the data decisions needed to drive the timing control loop are taken from a sequence detector rather than from a slicer. The motivation for using decisions from the sequence detector is that these decisions are more reliable than the slicer decisions. However, decisions from the sequence detector can only be generated with some inherent delay. Hence, the advantage of using more reliable decisions is partly lost due to the fact that additional decision delay is now involved.

To combat these problems, an attractive approach consists of compensating for the delay in the timing control loop. This can be achieved by introducing a prediction element into the design of the PLL. However, such approaches assume a specific model for the evolution of the signal frequency. More precisely, the frequency offset is assumed to be constant in the absence of noise. The drawback of this assumption is that the tracking capability of the delay compensation circuit is limited in case the actual frequency does not follow this model. It is for example well known that rapid variations in the frequency offset are often experienced in tape systems. Moreover, such systems have been limited to single channel applications.

SUMMARY

A system in one embodiment includes a global PLL circuit comprising multiple inputs, each input being for receiving an error signal associated with an individual channel; and a delay compensation circuit coupled to the global PLL circuit.

A method in one embodiment includes receiving multiple error signals, each error signal being associated with an individual channel; applying one or more delay compensation signals to the error signals; and outputting phase error output signals for each of the channels.

Any of these embodiments may be implemented in a magnetic data storage system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of PLL systems, as well as operation and/or component parts thereof.

In one general embodiment, a system includes a global PLL circuit comprising multiple inputs, each input being for receiving an error signal associated with an individual channel, and a delay compensation circuit coupled to the global PLL circuit.

In another general embodiment, a method includes receiving multiple error signals, each error signal being associated with an individual channel; applying one or more delay compensation signals to the error signals; and outputting phase error output signals for each of the channels.

Figure 1:
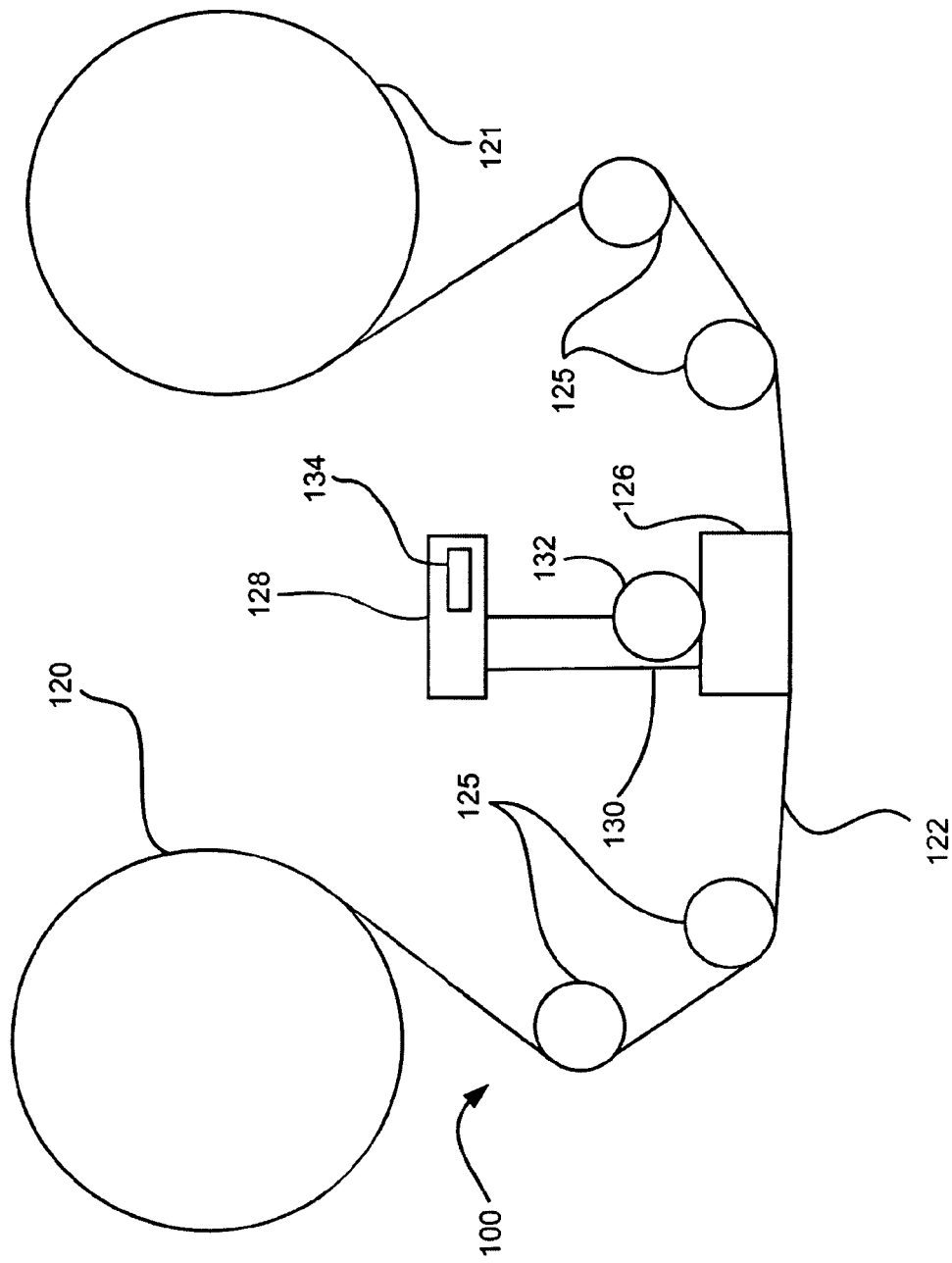
FIG. 1 is a schematic diagram of a simplified tape drive system according to one embodiment.

FIG. 1 illustrates a simplified tape drive 100 of a tape-based data storage system, which may be employed in the context of the present invention. While one specific implementation of a tape drive is shown in FIG. 1, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 1, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically controls head functions such as servo following, writing, reading, etc. The cable 130 may include read/write circuits to transmit data to the head 126 to be recorded on the tape 122 and to receive data read by the head 126 from the tape 122. An actuator 132 controls position of the head 126 relative to the tape 122.

An interface may also be provided for communication between the tape drive and a host (integral or external) to send and receive the data and for controlling the operation of the tape drive and communicating the status of the tape drive to the host, all as will be understood by those of skill in the art.

Figure 2:
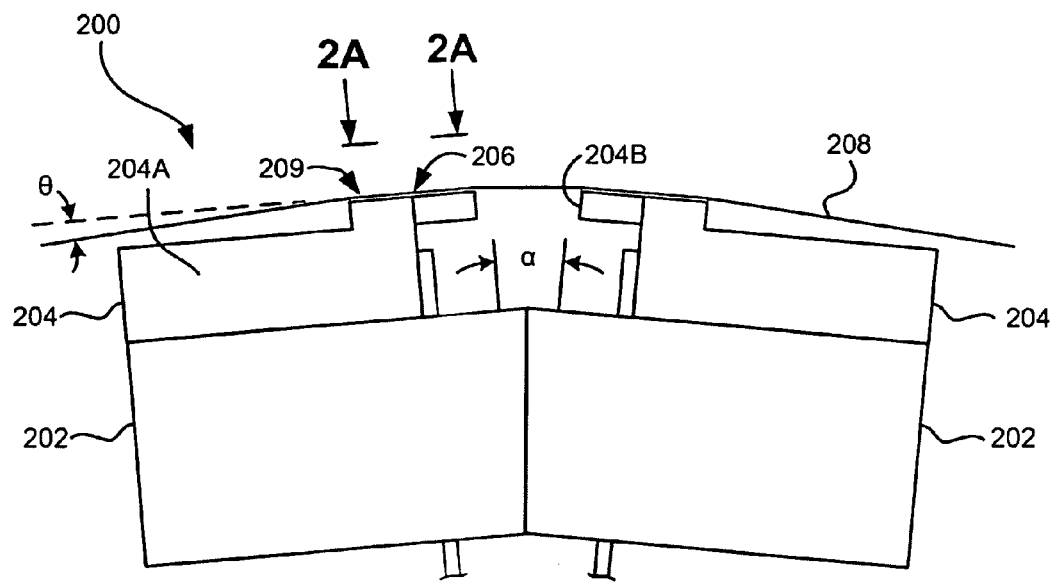
FIG. 2 illustrates a side view of a flat-lapped, bi-directional, two-module magnetic tape head according to one embodiment.

By way of example, FIG. 2 illustrates a side view of a flat-lapped, bi-directional, two-module magnetic tape head 200 which may be implemented in-the context of the present invention. As shown, the head includes a pair of bases 202, each equipped with a module 204, and fixed at a small angle a with respect to each other. The bases are typically "U-beams" that are adhesively coupled together. Each module 204 includes a substrate 204A and a closure 204B with a gap 206 comprising readers and/or writers situated therebetween. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between ⅛ degree and 4½ degrees.

The substrates 204A are typically constructed of a wear resistant material, such as a ceramic. The closures 204B made of the same or similar ceramic as the substrates 204A.

The readers and writers may be arranged in a piggyback configuration. The readers and writers may also be arranged in an interleaved configuration. Alternatively, each array of channels may be readers or writers only. Any of these arrays may contain one or more servo readers.

Figure 2A:
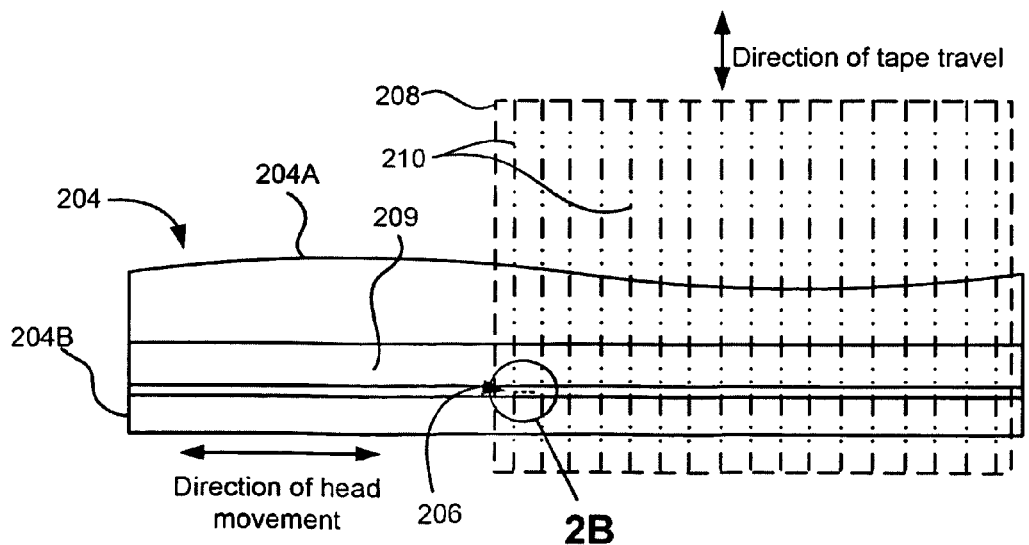
FIG. 2A is a tape bearing surface view taken from Line 2A of FIG. 2.

FIG. 2A illustrates the tape bearing surface 209 of one of the modules 204 taken from Line 2A of FIG. 2. A representative tape 208 is shown in dashed lines. The module 204 is preferably long enough to be able to support the tape as the head steps between data bands.

In this example, the tape 208 includes 4-22 data bands, e.g., with 16 data bands and 17 servo tracks 210, as shown in FIG. 2A on a one-half inch wide tape 208. The data bands are defined between servo tracks 210. Each data band may include a number of data tracks, for example 96 data tracks (not shown). During read/write operations, the elements 206 are positioned within one of the data bands. Outer readers, sometimes called servo readers, read the servo tracks 210. The servo signals are in turn used to keep the elements 206 aligned with a particular track during the read/write operations.

Figure 2B:
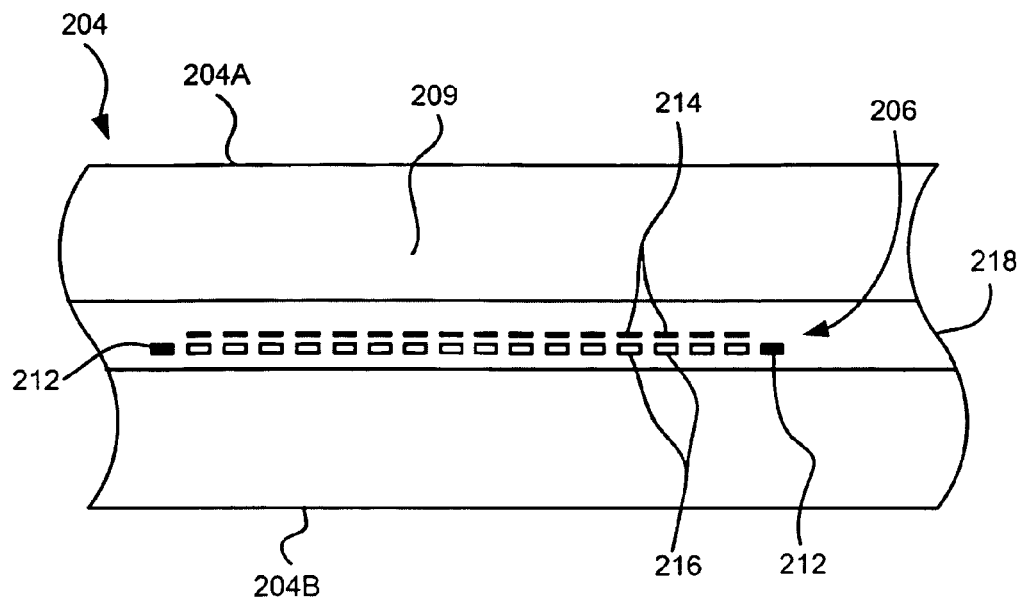
FIG. 2B is a detailed view taken from Circle 2B of FIG. 2A.

FIG. 2B depicts a plurality of read and/or write elements 206 formed in a gap 218 on the module 204 in Circle 2B of FIG. 2A. As shown, the array of elements 206 includes, for example, 16 writers 214, 16 readers 216 and two servo readers 212, though the number of elements may vary. Illustrative embodiments include 8, 16, 32, and 64 elements per array 206. A preferred embodiment includes 32 readers per array and/or 32 writers per array. This allows the tape to travel more slowly, thereby reducing speed-induced tracking and mechanical difficulties. While the readers and writers may be arranged in a piggyback configuration as shown in FIG. 2B, the readers 216 and writers 214 may also be arranged in an interleaved configuration. Alternatively, each array of elements 206 may be readers or writers only, and the arrays may contain one or more servo readers 212. As noted by considering FIGS. 2 and 2A-B together, each module 204 may include a complementary set of elements 206 for such things as bi-directional reading and writing, read-while-write capability, backward compatibility, etc.

Figure 2C:
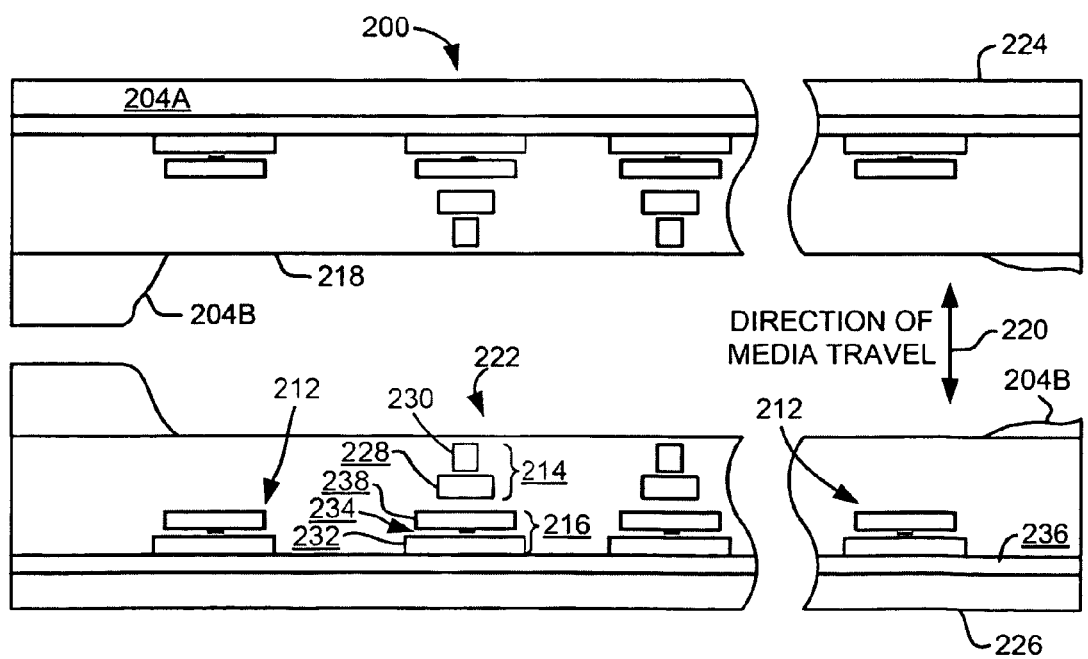
FIG. 2C is a detailed view of a partial tape bearing surface of a pair of modules.

FIG. 2C shows a partial tape bearing surface view of complimentary modules of a magnetic tape head 200 according to one embodiment. In this embodiment, each module has a plurality of read/write (R/W) pairs or transducers in a piggyback configuration formed on a common substrate 204A and an optional electrically insulative layer 236. The writers, exemplified by the write head 214 and the readers, exemplified by the read head 216, are aligned parallel to a direction of travel of a tape medium thereacross to form an R/W pair, exemplified by the R/W pair 222.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked MR head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in the gap 218 created above an electrically conductive substrate 204A (partially shown), e.g., of AlTiC, in generally the following order for the R/W pairs 222: an insulating layer 236, a first shield 232 typically of an iron alloy such as NiFe (permalloy), CZT or Al—Fe—Si (Sendust), a sensor 234 for sensing a data track on a magnetic medium, a second shield 238 typically of a nickel-iron alloy (e.g., 80/20 Permalloy), first and second writer pole tips 228, 230, and a coil (not shown).

The first and second writer poles 228, 230 may be fabricated from high magnetic moment materials such as 45/55 NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

Note that while the foregoing has referred to a tape drive system, this has been presented by way of example only, and the teachings herein are applicable to implementations in any type of device or circuit using a PLL.

Figure 3:
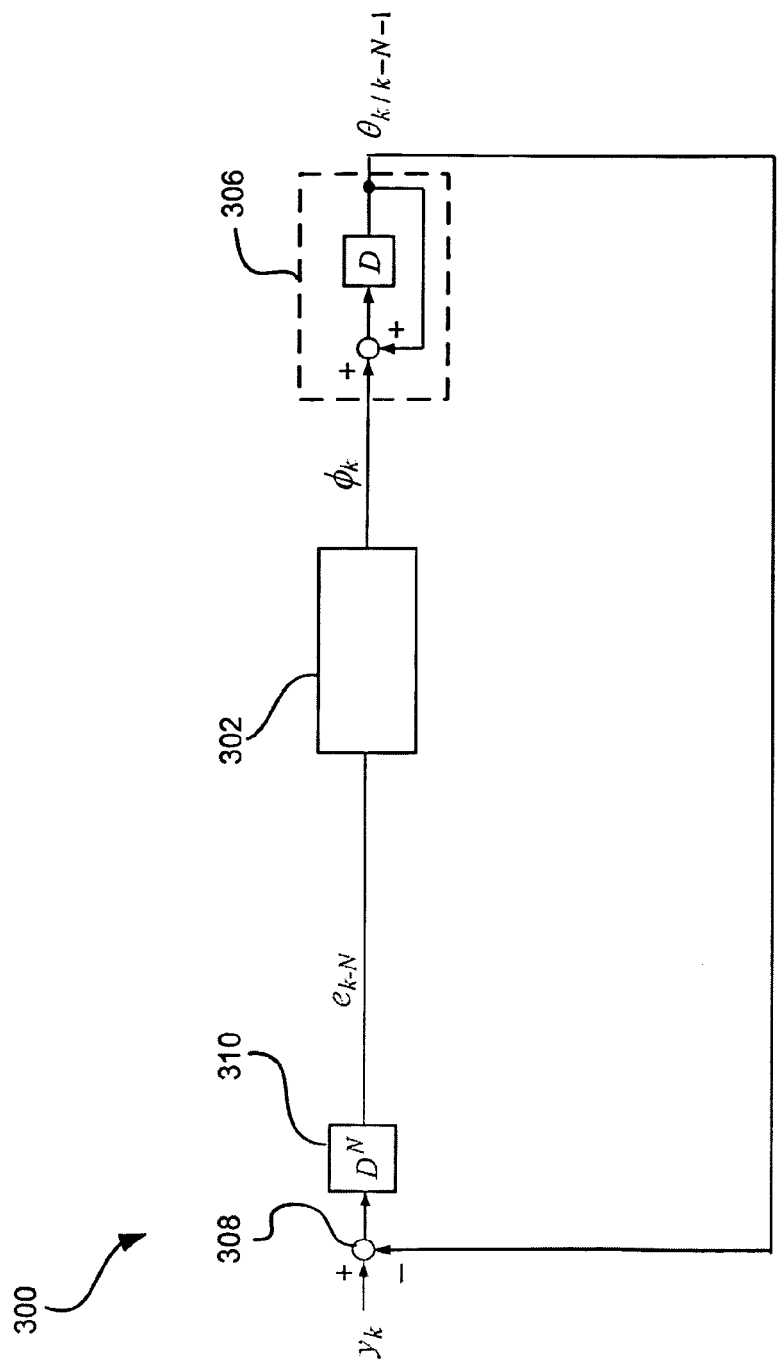
FIG. 3 is a block diagram of a single-channel PLL according to one illustrative embodiment.

FIG. 3 shows a single-channel PLL 300 according to one illustrative embodiment. A PLL circuit such as PLL 300 can be provided for each channel of a device such as the tape drive system 100 presented above and in FIG. 1. Particularly, for a tape head having 16 readers that operate simultaneously, each reader is associated with one of the 16 channels. For simplicity, a single PLL circuit 300 is shown in FIG. 3, it being understood that several such PLL circuits 300 may be present in a given embodiment.

As noted above, PLL circuits have an inherent loop delay. As discussed below, several schemes are presented for compensating for this delay.

One aspect of the present invention includes applying a correction term to the delayed phase error signal that enters the PLL loop filter. This correction term is obtained from the "current" phase and frequency estimates generated by the PLL circuit. In particular, the frequency-estimate dependent part of this correction signal is such that good tracking of frequency variations is enabled. In a preferred embodiment, this is achieved by summing up the frequency register contents within a sliding time-window of length N, where N is the total loop delay to be compensated for. One advantage of the approach is that the delay compensation scheme does not make any assumptions for the model of frequency offset and is applicable to multi-track applications such as tape-drive systems. It is, therefore, better suited to applications such as tape systems where it is desirable to track frequency variations accurately.

Another aspect of the present invention is the application of delay compensation in connection with global liming recovery. The delay compensation circuit implemented on each channel is directly compatible with global PLL schemes. Alternatively, a global delay compensation circuit is disclosed which is also easily combined with global PLL techniques and represents a simple add-on for such global techniques.

With continued reference to FIG. 3, a reference phase signal $y_k$ is received by the PLL 300. A phase signal $\theta_{k/k-N-1}$ is compared to the reference signal and an error signal $e_{k-N}$ is generated at the adder 308. The error signal is input to the loop filter 302 after a delay of N bit durations represented by the delay element $D^N$ 310. Latency compensated loop filter output $\phi_k$ is then coupled to an integrator 306, also known as voltage controlled oscillator (VCO). The integrator 306 transforms its input into a phase signal $\theta_{k/k-N-1}$.

While the output of the adder 308 could be input directly to a conventional loop filter 302, it experiences a delay of N bit durations, $D^N$ 310. The delay N may depend on the implementation, and may be estimated or selected during design. The delay N is also sometimes referred to in the literature as $z^{-N}$.

Accordingly, $D^0$ means no delay, $D^1$ means a delay of one bit duration, $D^2$ means a delay of two bit durations, and so on. $D^N$ creates latency in the circuit and cannot be removed. Therefore, the following description provides several illustrative approaches to compensate for $D^N$.

The loop filtering may be provided, at least in part, by a global PLL circuit. Global PLL, while itself not a PLL, takes advantage of the fact that in tape-based and/or other multi-channel applications, multiple processes are taking place across several channels. For instance, in multichannel tape reading or writing, the read and write processes take place simultaneously across several channels, e.g., 16 tracks in parallel. A global PLL circuit in one embodiment includes a circuit that collects information from several or all of the PLLs associated with the various channels, generates global information, and distributes the global information to the various channels. Each channel uses that information for its PLL. For example, in a multitrack tape embodiment, when reading back several signals in parallel, the PLL information can be shared among channels so that each of the channels operates in a more robust fashion. For example, the frequency variations across all channels in tape-based applications are typically very well correlated, so if one channel experiences a temporary disturbance, that disturbance not significantly affecting other channels, the timing information from the other channels can primarily be used on the channel subject to the disturbance.

Figure 4:
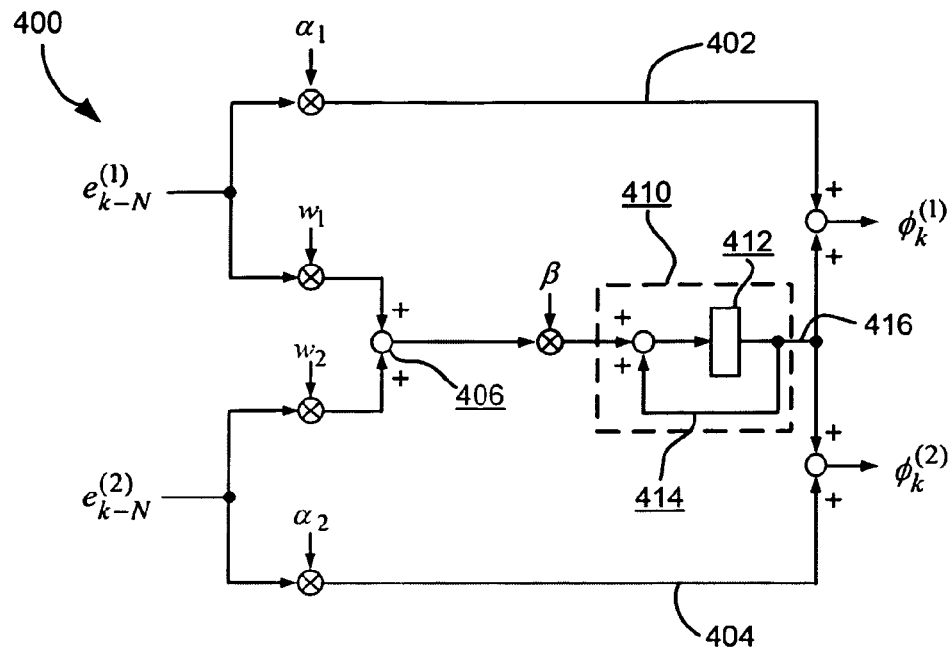
FIG. 4 is a block diagram of a global PLL circuit according to one embodiment.
Figure 5:
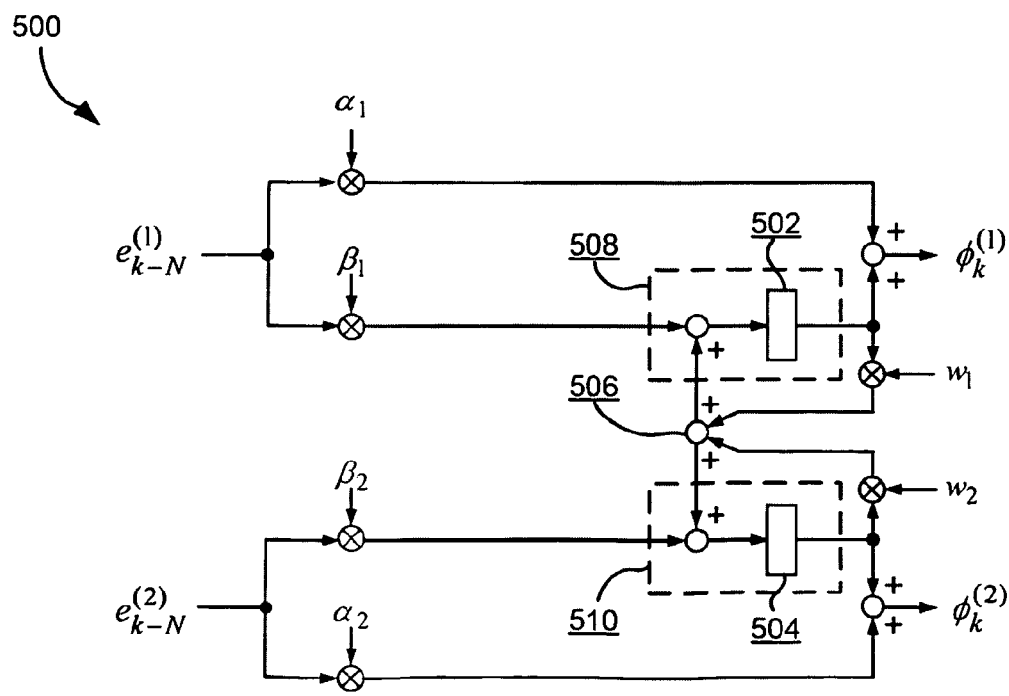
FIG. 5 is a block diagram of a global PLL circuit according to one embodiment.

FIGS. 4 and 5 show two different ways of creating a global PLL circuit. There are many other ways, but these are presented by way of example. For simplicity, only two channels are shown. Those skilled in die art will appreciate that the teachings herein are extendible to many channels, such as 8, 16, 32, 64, etc.

FIG. 4 is a block diagram of a global PLL circuit 400 according to one embodiment. The global PLL circuit may function as the loop filter for several PLLs, such as an array of PLLs 300 as shown in FIG. 3. This embodiment uses a common integrator 410. Particularly, assuming two channels and two PLLs, instead of having two independent loop filters, a common integrator 410 is coupled to the output of the loop coefficient β multiplier. This creates one frequency signal 416 that is shared by both channels to generate $\phi_k^{(1)}$ and $\phi_k^{(2)}$.

With reference to FIG. 4, error signals $e^{(1)}_{k-N}$ and $e^{(2)}_{k-N}$ are input to the global PLL circuit 400. The error signals $e^{(1)}_{k-N}$ and $e^{(2)}_{k-N}$ each have a delay of k–N and represent phase errors.

In the outside lines 402, 404, the error signals are multiplied by a loop coefficient $\alpha_1$, $\alpha_2$. In the inside lines, the error signals are multiplied by a weighting factor $w_1$, $w_2$ and combined at adder 406. The combined signal is multiplied by another loop coefficient β. A common integrator 410 is coupled to the output of the loop coefficient β multiplier. The integrator 410 integrates the phase error signal and creates an estimate found on the register 412 in conjunction with a feedback loop 414, to create one frequency signal on line 416 that is shared by both channels.

The output of the integrator 410 is combined with the error signals from lines 402, 404 as modified by the first loop coefficients $\alpha_1$, $\alpha_2$ to generate phase error output signals $\phi_k^{(1)}$ and $\phi_k^{(2)}$.

Referring to FIGS. 3 and 4, $\phi_k^{(1)}$ and $\phi_k^{(2)}$ may be input to a respective integrator 306 (e.g., VCO) of each channel's PLL. In other words, there would be two integrators (e.g., VCOs), one for each channel. Each respective integrator 306 then outputs the phase signals $\theta_{k/k-N-1}^{(1)}$ and $\theta_{k/k-N-1}^{(2)}$.

In this or any other embodiment, the coefficients and weighting factors α, β, w, etc. may be selected during circuit design, e.g., by simulation, according to theory, etc. Moreover, at least α and β may be conventional values used in conventional PLLs. The weighting factors w can be fixed or adaptive. In the latter case, the system can monitor the channels and adjust w dynamically based on the monitoring. For example, if the quality of the first channel appears to become degraded, the system can reduce the weighting of that channel (decrease $w_1$), so that the first channel contributes less to the global frequency signal than the contribution of the other channel(s), which are more reliable.

The global PLL circuit 500 of FIG. 5 also generates a global frequency signal, but in a different manner. The upper and lower circuits have their own frequency registers 502, 504, the outputs of which are multiplied by weighting factors $w_1$ and $w_2$, respectively, and combined at adder 506. The output of the adder 506, which is a global frequency signal shared by the channels, is sent to the inputs of the frequency accumulators 508, 510 of each channel.

Figure 6:
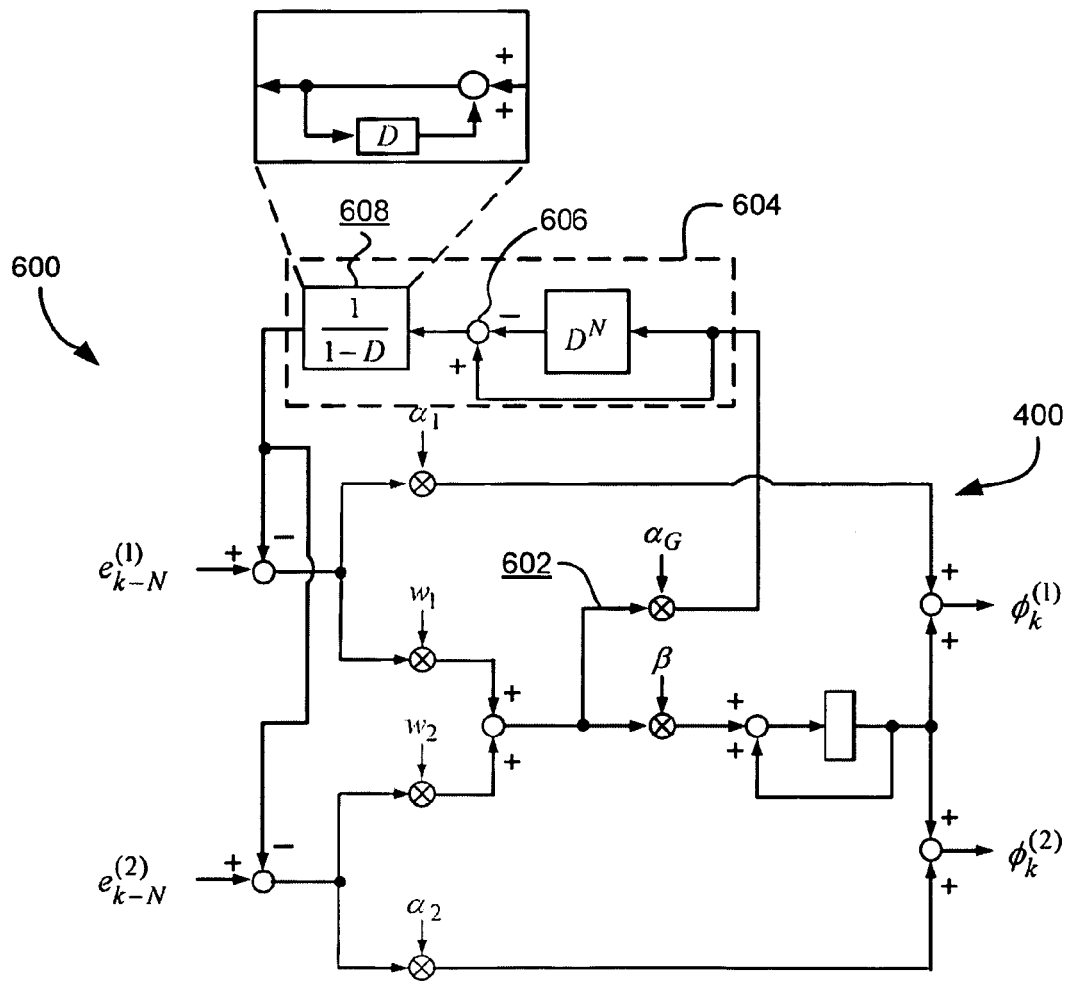
FIG. 6 is a block diagram of a delay compensation circuit associated with the global PLL circuit of FIG. 4 according to one embodiment.
Figure 7:
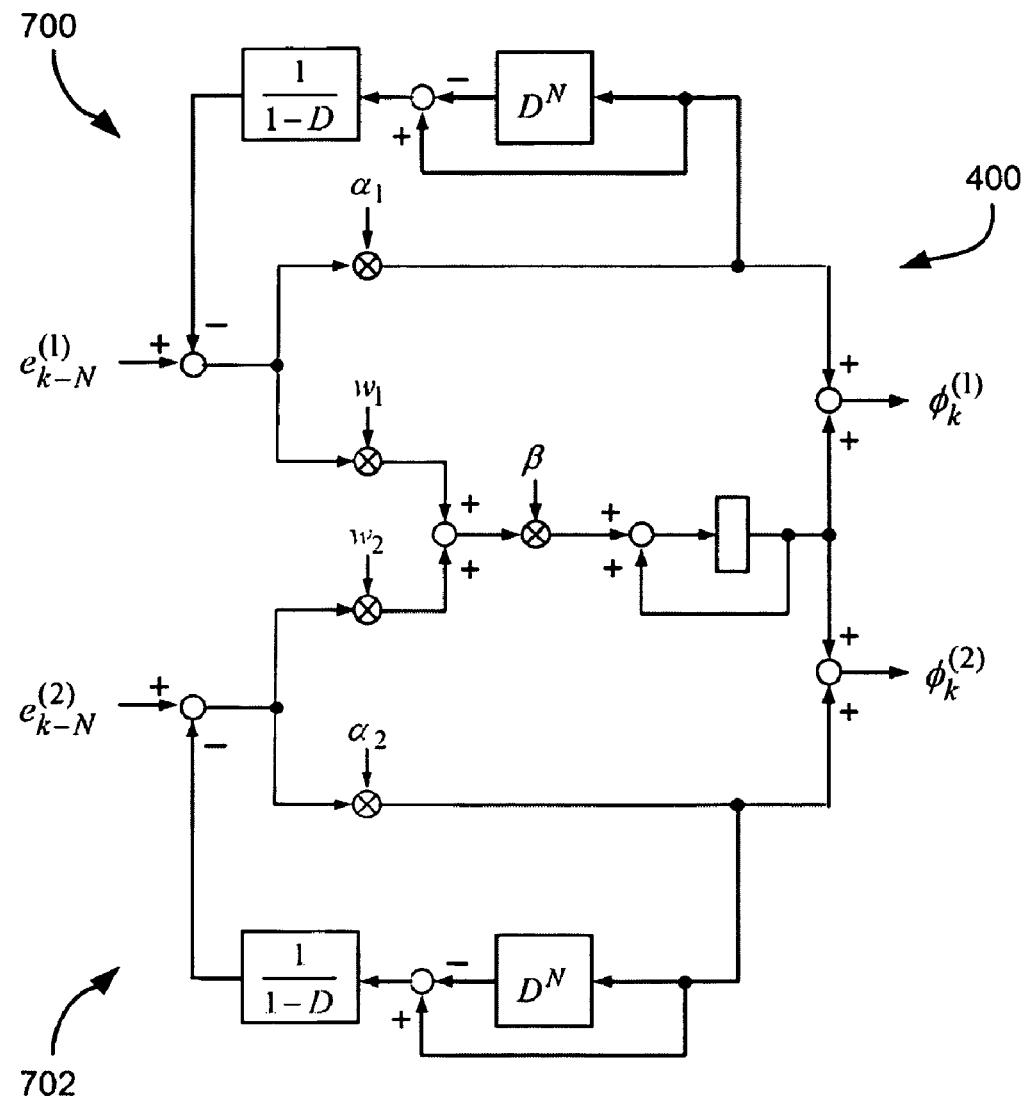
FIG. 7 is a block diagram of a delay compensation circuit associated with the global PLL circuit of FIG. 4 according to one embodiment.
Figure 8:
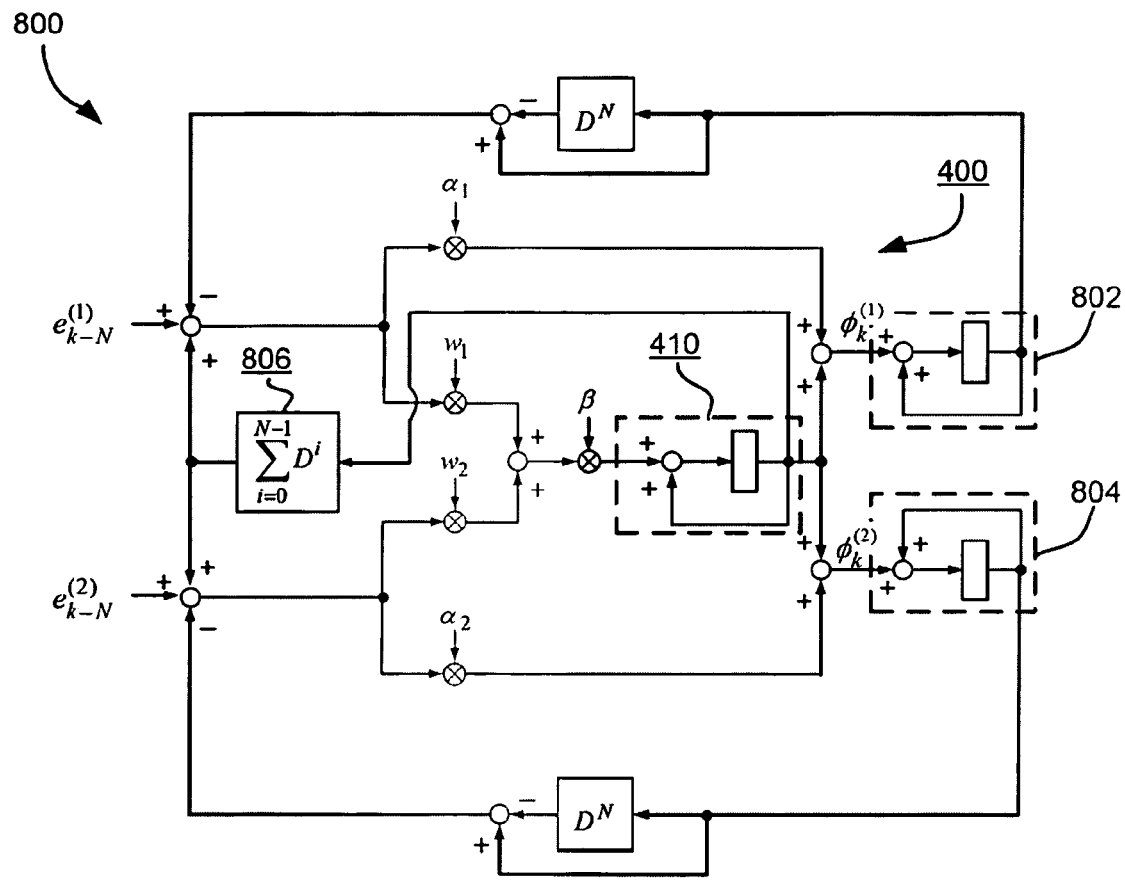
FIG. 8 is a block diagram of a delay compensation circuit associated with the global PLL circuit of FIG. 4 according to one embodiment.
Figure 9:
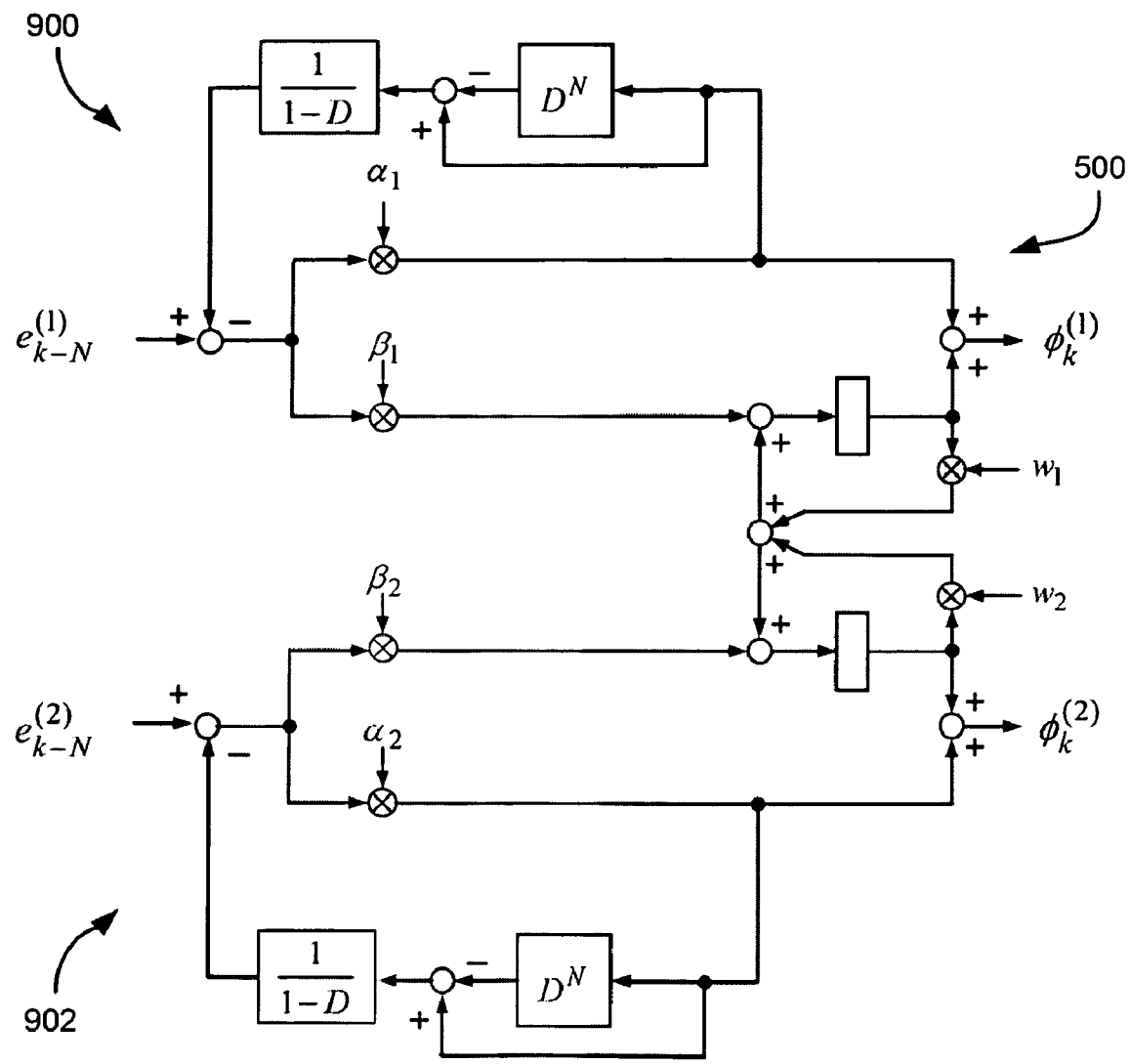
FIG. 9 is a block diagram of a delay compensation circuit associated with the global PLL circuit of FIG. 5 according to one embodiment.
Figure 10:
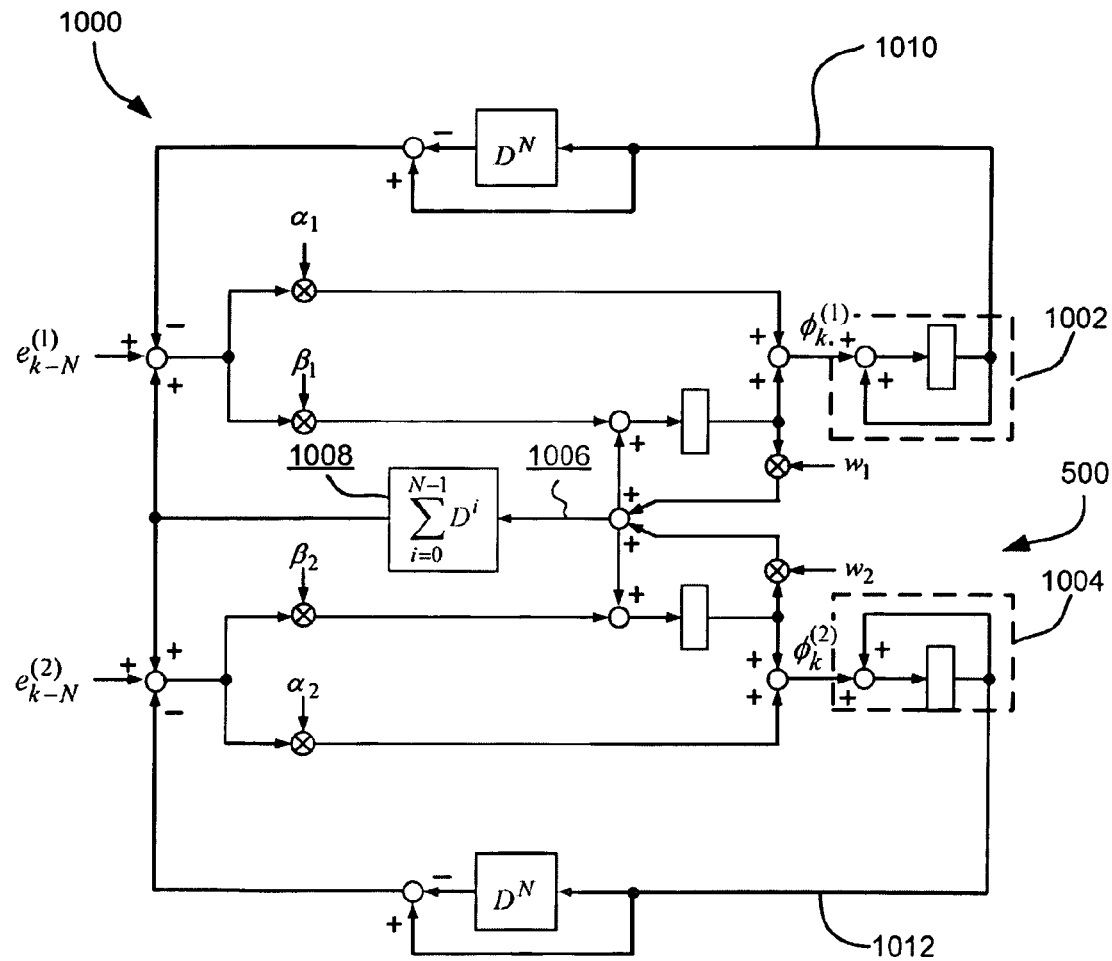
FIG. 10 is a block diagram of a delay compensation circuit associated with the global PLL circuit of FIG. 5 according to one embodiment.

FIGS. 6-10 illustrate various approaches for compensating for the loop delay in conjunction with a global PLL circuit. Note that while the approaches of FIGS. 6-8 are directed to the global PLL circuit of FIG. 4, and the approaches of FIGS. 9-10 are directed to the global PLL circuit of FIG. 5, the teachings are generally applicable to other types of global PLL circuits. Moreover, the delay compensation circuits shown in FIGS. 6-10 are not the only ways to compensate for loop delay.

Referring first to FIG. 6, a delay compensation circuit 600 has been added to the global PLL circuit 400 of FIG. 4. The operation of the global PLL circuit 400 of FIG. 4 is the same as that described above, and so is not discussed further. The delay compensation circuit 600 receives as input the global phase error signal on line 602 and multiplies it by a global coefficient $\alpha_G$. The modified signal enters a delay compensation section 604, the output of which is distributed to the two channels. In the delay compensation section, the modified global phase error signal on line 602 is delayed by N and subtracted from the modified signal at module 606, after which it is applied to section 608. Section 608 has a transfer characteristic that is denoted by 1/(1–D) in D-transform notation. This characteristic represents an integrator, the circuit implementation of which is shown in FIG. 6 just above section 608. The output of this single delay compensation circuit 604 is used to compensate for the delay of all channels. Particularly, the output is subtracted from the error signals $e^{(1)}_{k-N}$ and $e^{(2)}_{k-N}$ entering the circuit 400.

One advantage to the approach shown in FIG. 6 is that there is only one delay compensation circuit needed.

FIG. 7 is a block diagram of a delay compensation circuit having portions 700, 702 that provide delay compensation to the global PLL circuit 400 of FIG. 4 on a per channel basis. The delay compensation circuit portions 700, 702 of FIG. 7 function in a similar manner to the delay compensation section 604 of FIG. 6. The output of each delay compensation circuit 700, 702 is subtracted from the error signals $e^{(1)}_{k-N}$ and $e^{(2)}_{k-N}$ associated with its channel.

One advantage to the approach shown in FIG. 7 is that the delay compensation is performed for each of the channels independently, possibly leading to more accurate delay compensation than in the case of FIG. 6. Also, in this case, a problem in one of the delay compensation circuits will not significantly affect all other channels.

FIG. 8 is a block diagram illustrating a delay compensation circuit 800 that provides delay compensation to the global PLL circuit 400 of FIG. 4, with the addition of integrators 802, 804 for each channel. Note that the integrators 802, 804 correspond to the VCOs of the PLLs for the various channels.

In this embodiment, the frequency term is based on a global signal, while the phase terms are based on the individual phase signals of each channel. Looking first to the frequency term, an output of the integrator 410, which may be referred to as a global frequency error signal, is coupled to a summation circuit 806. The summation circuit 806 adds N delayed versions of the global frequency error signal together. In one particularly preferred approach, the summation circuit 806 delays the input signal by $D^0, D^1, D^2, \ldots D^{N-1}$. All these delayed signals are added by the summation circuit 806. The output of the summation circuit 806 is added to each of the error signals $e^{(1)}_{k-N}$ and $e^{(2)}_{k-N}$ entering the circuit 400.

The three techniques (and other variants) shown in FIGS. 6-8 can also be applied to the global PLL circuit 500 of FIG. 5. For example, FIG. 9 is a block diagram showing one approach using a per-channel scheme with the global PLL circuit 500 of FIG. 5. As in FIG. 7, the delay compensation circuit of FIG. 9 is provided with one portion 900, 902 per channel. The delay compensation circuit portions 900, 902 may function similarly or the same as those 700, 702 of FIG. 7.

FIG. 10 is a block diagram illustrating a delay compensation circuit 1000 that provides delay compensation to the global PLL circuit 500 of FIG. 5, with the addition of integrators 1002, 1004 for each channel. Note that the integrators 1002, 1004 may correspond to the VCOs of the PLLs for the various channels.

As in FIG. 8, the embodiment of FIG. 10 includes a global correction term that uses the global frequency signal (combined signal) on line 1006 as input to a summation circuit 1008. The individual phases are taken into account by the top and bottom portions 1010, 1012 of the delay compensation circuit 1000.

Any of the circuitry described above may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products such as those having a display, a keyboard or other input device, and a central processor.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
   a global PLL circuit comprising multiple inputs, each input being for receiving an error signal associated with an individual channel; and
   a delay compensation circuit coupled to the global PLL circuit, wherein an output of the delay compensation circuit is subtracted from the error signal of at least one of the channels.

2. A system as recited in claim 1, further comprising a plurality of PLLs, each PLL being associated with one of the channels, the error signals being generated by the PLLs.

3. A system as recited in claim 2, wherein the global PLL circuit functions as a loop filter for each of the plurality of PLLs.

4. A system as recited in claim 1, wherein the global PLL circuit comprises a common integrator, the common integrator receiving a combined version of the error signals and outputting a common frequency signal shared by the channels.

5. A system as recited in claim 4, wherein the delay compensation circuit includes a portion associated with each channel, each portion receiving the error signal associated with the same channel as the portion and no other error signals, an output of each portion being coupled to the input associated with the same channel as the portion.

6. A system as recited in claim 4, further comprising
   a magnetic head having multiple transducers selected from a group consisting of readers and writers, each of the transducers being associated with one of the channels in communication with the global PLL circuit;
   a drive mechanism for passing a magnetic recording tape over the head; and
   a controller in communication with the head.

7. A system, comprising:
   a global PLL circuit comprising multiple inputs, each input being for receiving an error signal associated with an individual channel; and
   a delay compensation circuit coupled to the global PLL circuit,
   wherein the global PLL circuit comprises a common integrator, the common integrator receiving a combined version of the error signals and outputting a common frequency signal shared by the channels,
   wherein the delay compensation circuit receives the combined version of the error signals, an output of the delay compensation circuit being coupled to the inputs of the global PLL circuit.

8. A system as recited in claim 7, wherein an output signal from the delay compensation circuit is subtracted from the error signals.

9. A system as recited in claim 7, wherein a global coefficient is applied to the combined version of the error signals.

10. A system, comprising:
    a global PLL circuit comprising multiple inputs, each input being for receiving an error signal associated with an individual channel; and
    a delay compensation circuit coupled to the global PLL circuit,
    wherein the global PLL circuit comprises a common integrator, the common integrator receiving a combined version of the error signals and outputting a common frequency signal shared by the channels,
    wherein the delay compensation circuit includes a portion associated with each channel, each portion receiving the error signal associated with the same channel as the portion and no other error signals, an output of each portion being coupled to the input associated with the same channel as the portion,
    wherein an output signal from each of the portions is subtracted from the error signal associated with the same channel as the portion.

11. A system, comprising:
    a global PLL circuit comprising multiple inputs, each input being for receiving an error signal associated with an individual channel; and
    a delay compensation circuit coupled to the global PLL circuit,
    wherein the global PLL circuit comprises a common integrator, the common integrator receiving a combined version of the error signals and outputting a common frequency signal shared by the channels,
    wherein the delay compensation circuit includes a summation circuit receiving an output signal of the common integrator as input, an output of the summation circuit being coupled to the inputs of the global PLL circuit.

12. A system as recited in claim 11, wherein the summation circuit adds several delayed versions of the output signal of the common integrator.

13. A system, comprising:
    a global PLL circuit comprising multiple inputs, each input being for receiving an error signal associated with an individual channel;
    a delay compensation circuit coupled to the global PLL circuit, wherein the global PLL circuit comprises a common integrator, the common integrator receiving a combined version of the error signals and outputting a common frequency signal shared by the channels; and
    additional integrators coupled to outputs of the global PLL circuit, each of the additional integrators being associated with one of the channels, wherein the delay compensation circuit includes a portion associated with each channel, each portion receiving an output signal from the additional integrator associated with the same channel as the portion, an output of each portion being coupled to the input associated with the same channel as the portion.

14. A system, comprising:
a global PLL circuit comprising multiple inputs, each input being for receiving an error signal associated with an individual channel; and
a delay compensation circuit coupled to the global PLL circuit,
wherein the global PLL circuit comprises a common integrator, the common integrator receiving a combined version of the error signals and outputting a common frequency signal shared by the channels,
wherein the delay compensation circuit includes a summation circuit receiving an output signal of the common integrator as input, an output of the summation circuit being coupled to the inputs of the global PLL circuit; and further comprising additional integrators coupled to outputs of the global PLL circuit, each of the additional integrators being associated with one of the channels, wherein the delay compensation circuit includes a portion associated with each channel, each portion receiving an output signal from the additional integrator associated with the same channel as the portion, an output of each portion being coupled to the input associated with the same channel as the portion.

15. A system, comprising:
a global PLL circuit comprising multiple inputs, each input being for receiving an error signal associated with an individual channel; and
a delay compensation circuit coupled to the global PLL circuit,
wherein the global PLL circuit comprises a plurality of frequency accumulators, each frequency accumulator being associated with one of the channels, wherein outputs of the frequency accumulators are combined into a combined signal, wherein the combined signal is applied to inputs of each of the frequency accumulators.

16. A system as recited in claim 15, wherein the outputs of the frequency accumulators are each modified by weighting factors.

17. A system as recited in claim 16, wherein the weighting factors are selected dynamically.

18. A system as recited in claim 15, wherein the delay compensation circuit includes a portion associated with each channel, each portion receiving the error signal associated with the same channel as the portion and no other error signals, an output of each portion being coupled to the input associated with the same channel as the portion.

19. A system as recited in claim 18, wherein an output signal from each of the portions is subtracted from the error signal associated with the same channel as the portion.

20. A system as recited in claim 15, wherein the delay compensation circuit includes a summation circuit receiving the combined signal as input, an output of the summation circuit being coupled to the inputs of the global PLL circuit.

21. A system as recited in claim 20, wherein the summation circuit adds several delayed versions of the combined signal.

22. A system as recited in claim 15, further comprising additional integrators coupled to outputs of the global PLL circuit, each of the additional integrators being associated with one of the channels, wherein the delay compensation circuit includes a portion associated with each channel, each portion receiving an output signal from the additional integrator associated with the same channel as the portion, an output of each portion being coupled to the input associated with the same channel as the portion.

23. A system as recited in claim 15, wherein the delay compensation circuit includes a summation circuit receiving the combined signal as input, an output of the summation circuit being coupled to the inputs of the global PLL circuit; and further comprising additional integrators coupled to outputs of the global PLL circuit, each of the additional integrators being associated with one of the channels, wherein the delay compensation circuit includes a portion associated with each channel, each portion receiving an output signal from the additional integrator associated with the same channel as the portion, an output of each portion being coupled to the input associated with the same channel as the portion.

24. A system as recited in claim 15, further comprising
a magnetic head having multiple transducers selected from a group consisting of readers and writers, each of the transducers being associated with one of the channels in communication with the global PLL circuit;
a drive mechanism for passing a magnetic recording tape over the head; and
a controller in communication with the head.

25. A method, comprising:
receiving multiple error signals, each error signal being associated with an individual channel;
applying one or more delay compensation signals to the error signals;
outputting phase error output signals for each of the channels; and
combining outputs of a plurality of frequency accumulators into a combined signal, each frequency accumulator being associated with one of the channels and receiving at least the error signal associated with the channel, wherein the combined signal is applied to inputs of each of the frequency accumulators.

* * * * *